United States Patent [19]

Lade et al.

[11] Patent Number: 4,622,569
[45] Date of Patent: Nov. 11, 1986

[54] LATERAL BIDIRECTIONAL POWER FET WITH NOTCHED MULTI-CHANNEL STACKING AND WITH DUAL GATE REFERENCE TERMINAL MEANS

[75] Inventors: Robert W. Lade, Fort Myers, Fla.; James A. Benjamin, Waukesha; Herman P. Schutten, Milwaukee, both of Wis.

[73] Assignee: Eaton Corporation, Cleveland, Ohio

[21] Appl. No.: 618,537

[22] Filed: Jun. 8, 1984

[51] Int. Cl.$^4$ ............................................. H01L 29/78
[52] U.S. Cl. .................................. 357/23.4; 357/23.8; 357/23.14; 357/39; 357/55; 357/59
[58] Field of Search .................... 357/23.4, 55, 39, 59, 357/23.8, 23.14

[56] References Cited
U.S. PATENT DOCUMENTS 4,148,047 4/1979 Hendrickson ...................... 357/23.4

FOREIGN PATENT DOCUMENTS 55-95366 7/1980 Japan ................................. 357/23.4

Primary Examiner—Joseph E. Clawson, Jr.
Attorney, Agent, or Firm—Andrus, Sceales, Starke & Sawall

[57] ABSTRACT

A lateral bidirectional power FET (2) has a common drift region (6) between first and second stacks (8, 10) of alternating conductivity type layers (12-17 and 18-23). A notch (38) extends vertically downwardly into the drift region and laterally separates the stacks above the drift region. The stacks include a plurality of channel-containing regions (12-14 and 18-20) interleaved with a plurality of source regions (15-17 and 21-23). In the ON state, bidirectional current flows serially through the source regions and channels of each stack and through the drift region. In the OFF state, voltage is dropped across the plurality of junctions in series in the stacks, and the respective junctions with the drift region.

4 Claims, 3 Drawing Figures

LATERAL BIDIRECTIONAL POWER FET WITH NOTCHED MULTI-CHANNEL STACKING AND WITH DUAL GATE REFERENCE TERMINAL MEANS

BACKGROUND AND SUMMARY

The invention relates to power switching semiconductors, and more particularly to power MOSFETs (metal oxide semiconductor field effect transistors), and the like.

Lateral FET structure is provided for bidirectional power switching, including AC application. A common drift region is between first and second stacks of alternating conductivity type layers, each stack having a plurality of channel-containing regions interleaved with a plurality of source regions. The channels are gated ON by inverting the conductivity type thereof to afford bidirectional conduction serially through the stacks and the drift region. In the OFF state, the plurality of junctions in series between the layers of the stacks affords increased OFF state voltage blocking capability.

In preferred form, a semiconductor body is provided having a plurality of alternating conductivity type layers extending laterally horizontally, and stacked vertically. A notch is etched downwardly through the plurality of alternating conductivity type layers and into a drift region therebelow. The notch separates the layers into first and second laterally spaced stacks, each stack having a plurality of channel-containing regions interleaved with a plurality of source regions. A first main electrode contacts the top left source region, and a second main electrode contacts the top right source region. Insulated gate electrode means is disposed in the notch in close proximity to the layers of the stacks. The conductive current path traverses serially through the layers of one stack along one side of the notch, then through the drift region around the bottom of the notch, then serially through the layers of the other stack along the other side of the notch.

DETAILED DESCRIPTION

Figure 1:
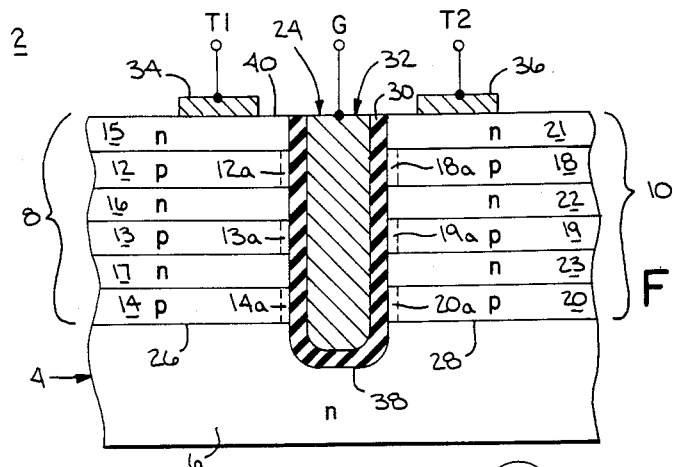
FIG. 1 is schematic sectional view of FET structure in accordance with the invention.

FIG. 1 shows lateral bidirectional power FET structure 2 in a semiconductor body 4. A common drift region 6 is between first and second stacks 8 and 10 of alternating conductivity type layers. Each stack has a plurality of channel-containing regions interleaved with a plurality of source regions. For example in first stack 8, channel-containing regions such as 12-14 are interleaved with source regions 15-17. In second stack 10, channel-containing regions 18-20 are interleaved with source regions 21-23. Gate means 24 is provided for gating ON the channels to invert the conductivity type thereof and afford conduction between the source regions through the drift region.

The source regions are of one conductivity type semiconductor material, such as n type. The channel-containing regions are of opposite conductivity type, such as p type, and form junctions with the source regions. Drift region 6 is of the one conductivity type semiconductor material, such as n type, and forms a first junction 26 with channel-containing region 14 of first stack 8, and forms a second junction 28 with channel-containing region 20 of second stack 10.

Gate means 24 includes a dielectric insulation layer 30 and a gate electrode 32 disposed proximate channels 12a-14a and 18a-20a and adapted for application of electricial potential for producing electric fields of sufficient intensity to invert the conductivity type in the channels. For example, a positive voltage potential on gate terminal G attracts electrons in region 12 to invert the conductivity in portion 12a to n type, and thus induce an n type conduction channel 12a between n type source regions 15 and 16, and so on for the remaining channels. Upon application of voltage of either polarity to source region 15 of first stack 8 relative to source region 21 of second stack 10, electric current can flow in a respective corresponding direction between them through the induced conduction channels and through drift region 6, under control of the electrical potential of gate means 24.

A first main electrode T1 is connected at metalization 34 to top source region 15 of first stack 8 distally opposite drift region 6. In the ON state, current between first main electrode T1 and drift region 6 flows through each of source regions 15-17 and interleaved channels 12a-14a. A second main electrode T2 is connected at metalization 36 to source region 21 of second stack 10 distally opposite drift region 6. In the ON state, current between second main electrode T2 and drift region 6 flows through each of source regions 21-23 and interleaved channels 18a-20a.

Notch means 38 extends between and separates first and second stacks 8 and 10 and extends into drift region 6. The alternating conductivity type layers in each stack 8 and 10 extend laterally horizontal. The direction of stacking is vertical. Notch 38 is anisotropically etched into the semiconductor body and extends downwardly from top major surface 40. Channels 12a-14a and 18a-20a extend generally vertically along the respective sides of notch 38. Drift region 6 is below the channels, around the bottom of the notch.

First main electrode T1 is connected to the top source region 15 of the first stack, and second main electrode T2 is connected to the top source region 21 of the second stack. The source regions and the channel-containing regions of first stack 8 are laterally spaced from the source regions and channel-containing regions of second stack 10 by notch 38 therebetween.

The current path in one direction between main electrodes T1 and T2 extends from top source region 15 downwardly through induced conduction channel 12a therebelow along the left side of notch 38, then downwardly through the next source region 16, then downwardly through induced conduction channel 13a, then downwardly through next source region 17, then downwardly through induced conduction channel 14a, and then downwardly into drift region 6, and around the bottom of notch 38, and then upwardly along the right side of notch 38, then upwardly through induced conduction channel 20a along the right side of the notch, then upwardly through source reigon 23, then upwardly through induced conduction channel 19a, then upwardly through source region 22, then upwardly through induced conduction channel 18a to top right source region 21. Current from main electrode T2 to main electrode T1 travels the same path but in the opposite direction, serially through the alternating channels and source regions on the right side of notch 38, then through drift region 6 around the bottom of the notch, then upwardly serially through the alternating channels and source regions on the left side of the notch.

Figure 2:
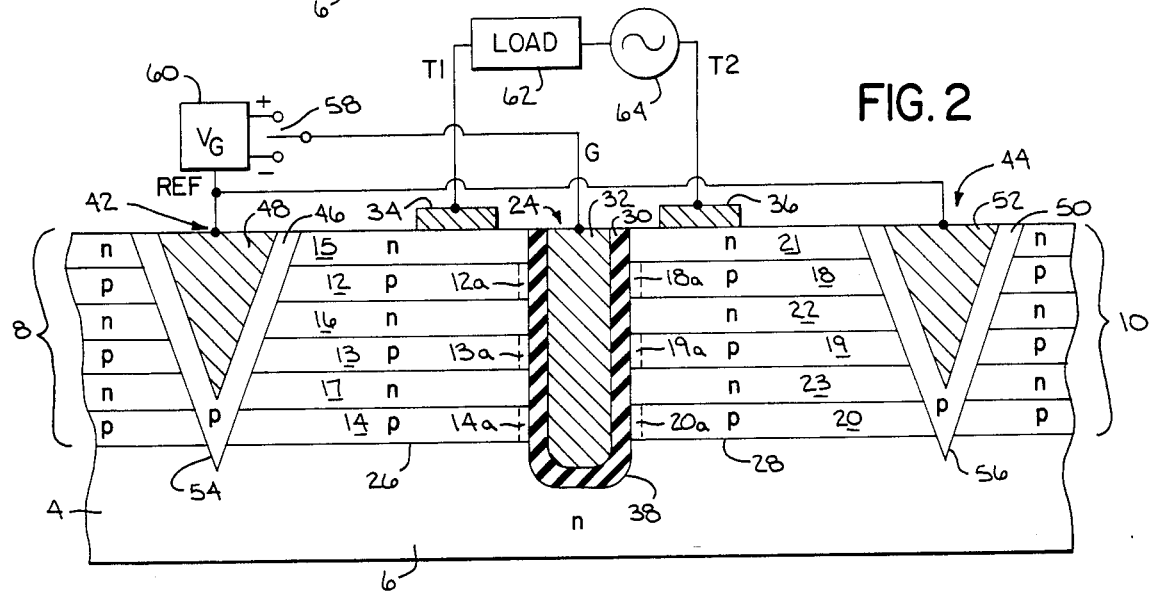
FIG. 2 is a view like FIG. 1 and shows one form of gate referencing structure.

FIG. 2 shows preferred gate referencing structure and like reference numerals from FIG. 1 are used where appropriate to facilitate understanding. Gate means 24 includes the noted insulation layer 30 extending along the inner surface of notch 38, and gate electrode 32 disposed in the notch along the insulation layer such that the gate electrode extends in close proximity along and electrically insulated from the layers of stacks 8 and 10. Induced conduction channels 12a-14a and 18a-20a extend generally vertically along the sides of notch 38.

First gate reference terminal means 42 is connected to channel-containing regions 12-14 in first stack 8. Second gate reference terminal means 44 is connected to channel-containing regions 18-20 in second stack 10. First gate reference terminal means 42 includes a first gate reference layer 46 of semiconductor material of the noted opposite conductivity type, such as p type. P layer 46 extends across and contacts the layers of first stack 8. Gate reference terminal 42 also includes a gate reference electrode 48 contacting gate reference layer 46. Second gate reference terminal 44 is comparable, and includes p type gate reference layer 50 extending across and contacting the layers of second stack 10, and gate reference electrode 52 contacting layer 50. First and second gate reference grooves 54 and 56 are anisotropically etched or notched vertically into respective first and second stacks 8 and 10 and receive respective gate terminals 42 and 44 therein.

Gate terminal G is connected through switch 58 to a source of gate biasing potential 60 which is referenced to the gate reference terminals 42 and 44. In the upward position of switch 58, a positive gate biasing potential is applied to gate electrode 32 relative to reference electrodes 48 and 52, to thus apply electrical potential across channel-containing regions 12-14 and 18-20 for producing electric fields of sufficient intensity to attract electrons into channels 12a-14a and 18a-20a to invert the conductivity type in the channels to n type and afford induced conduction channels. Main terminals T1 and T2 are connected in an AC load line including load 62 and AC source 64, to afford the above described bidirectional conduction in the ON state.

In the OFF state, switch 58 is in a central position, or may be in a downward position such that a negative potential is applied to gate electrode 32 relative to reference electrodes 48 and 52, to prevent attraction of minority carrier electrons toward notch 38 and prevent unwanted inducement of conduction channels at 12a-14a and 18a-20a. In the OFF state, the voltage is dropped serially across the plurality of junctions between the layers in the stacks, in addition to the blocking afforded by junctions 26 and 28, thus affording enhanced OFF state voltage blocking capability.

Figure 3:
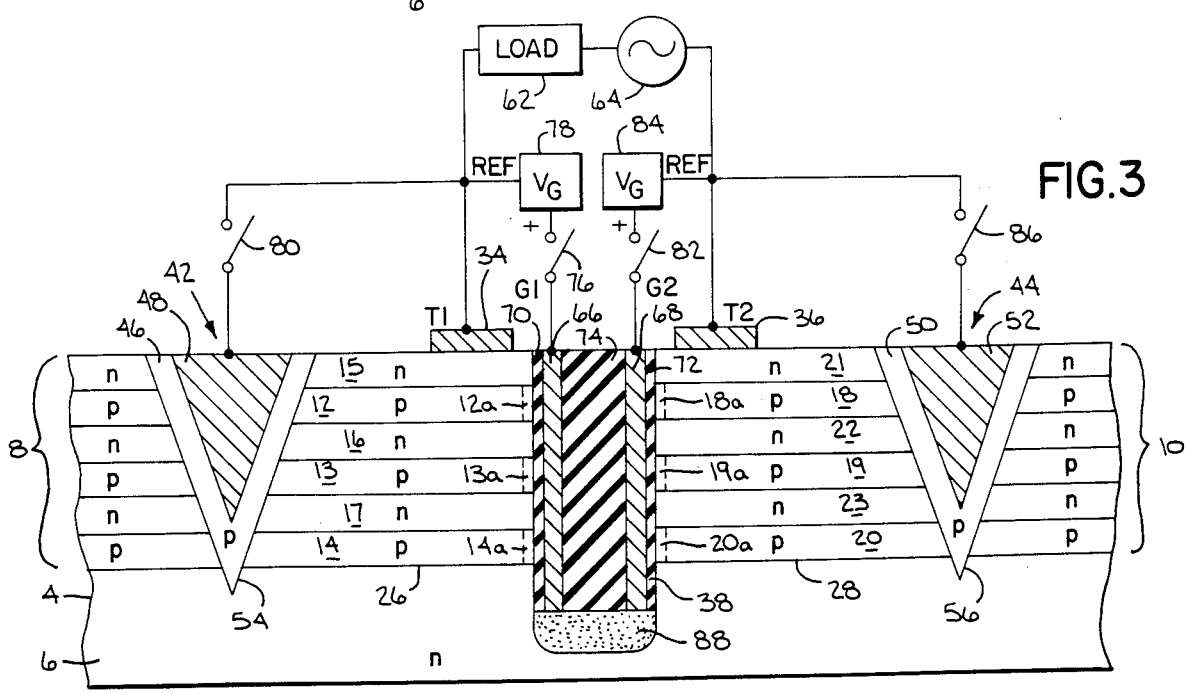
FIG. 3 is a view like FIG. 2 and shows alternate gating.

An alternative gating arrangement is shown in FIG. 3 where like reference numerals are used from FIG. 2 where appropriate to facilitate understanding. The arrangement in FIG. 3 addresses those applications where it may be desirable to have the gating potential referenced to the main terminals. Gate electrode 32 of FIG. 2 is replaced by a split gate structure in FIG. 3 including a first gate electrode 66 for channels 12a-14a, and a second gate electrode 68 for channels 18a-20a. Respective layers of insulation 70 and 72 insulate the electrodes from the channels, and a central layer of insolation 74 separates the electrodes. First gate electrode 66 is connected through terminal G1 and switch 76 to a first source of gate biasing potential 78 which is referenced to first main electrode T1 and which is also referenced through switch 80 to gate reference terminal 42. Second gate electrode 68 is connected through terminal G2 and switch 82 to a second source of gate biasing potential 84 which is referenced to second main terminal T2 and also referenced through switch 86 to second gate reference terminal 44. In the ON state, switches 80, 76, 82 and 86 are in their leftward position. In the OFF state, switches 80, 76, 82 and 86 are in their rightward position. The bottom of notch 38 may include an anodized porous silicon region 88 which is single crystalline with body 4 but substantially nonconductive, to increase the drift region current path length around the bottom of the notch.

It is recognized that various modifications are possible within the scope of the appended claims.

We claim:

1. A bidirectional FET comprising in a semiconductor body:
   a first stack of alternating conductivity type layers comprising:
     a plurality of source regions of one conductivity type;
     a plurality of channel-containing regions of opposite conductivity type inteleaved with said source regions;
     said first stack having a source region at one end and a channel-containing region at the other end, said layers of said first stack extending laterally horizontally, and the direction of stacking being vertical, said source region at said one end of said first stack being at the top of the latter, said channel-containing region at said other end of said first stack being at the bottom of the latter;
   a drift region of said one conductivity type below and forming a junction with said bottom channel-containing region of said first stack;
   a second stack of alternating condutivity type layers comprising:
     a plurality of source regions of one conductivity type;
     a plurality of channel-containing regions of opposite conductivity type interleaved with said last mentioned source regions;
     said second stack having a source region at one end and a channel-containing region at the other end, said layers of said second stack extending laterally horizontally, and the direction of stacking being vertical, said source region at said one end of said second stack being at the top of the latter, said channel-containing region at said other end of said second stack being at the bottom of the latter and forming a junction with said drift region therebelow;
   a notch extending downwardly between and separating said first and second stacks and extending into said drift region, said stacks being laterally spaced by said notch therebetween;
   insulated gate electrode means in said notch proximate said channel-containing regions and adapted for application of electrical potential for producing electric fields of sufficient intensity to invert the conductivity type in said channel-containing regions to said one conductivity type to induce conduction channels therethrough between said source regions and enable a bidirectional current conduction path through said drift region and through said stacks between said top source regions, the conductive current path in one direction traversing serially through the layers of one stack along one side of said notch then through said drift region around the bottom of said notch then serially through the layers of the other stack along the other side of said notch, the conductive current path in the opposite direction traversing serially through the layers of said other stack along said other side of said notch then through said drift region around the bottom of said notch then serially through the layers of said one stack along said one side of said notch;

gate voltage supply means for applying said potential to said gate electrode means in said notch;

a first main electrode connected to said top source region of said second stack;

a second main electrode connected to said top source region of said second stack;

a first gate reference groove notched vertically into said first stack;

first gate reference terminal means in said first gate reference groove and connected to said channel-containing regions of said opposite conductivity type in said first stack, said first gate reference terminal means comprising:
- a first gate reference layer of semiconductor material of said opposite conductivity type in said first gate reference groove and extending across and contacting said layers of said first stack;
- a first gate electrode in said first gate reference groove and contacting said first gate reference layer of semiconductor material of said opposite conductivity type;

a second gate reference groove notched vertically into said second stack;

second gate reference terminal means in said second gate reference groove and connected to said channel-containing regions of said opposite conductivity type in said second stack, said second gate reference terminal means comprising:
- a second gate reference layer of semiconductor material of said opposite conductivity type in said second gate reference groove and extending across and contacting said layers of said second stack;
- a second gate reference electrode in said second gate reference groove and contacting said second gate reference layer of said opposite conductivity type;

means ohmically connecting said gate voltage supply means to said first and second gate reference electrodes to reference said gate voltage supply means to each of said first and second gate reference terminal means.

2. The invention according to claim 1 comprising means ohmically connecting said first and second gate reference electrodes to each other and to said gate voltage supply means.

3. The invention according to claim 1 comprising means ohmically connecting said first gate reference electrode to said first main electrode, and means ohmically connecting said second gate reference electrode to said second main electrode.

4. The invention according to claim 3 wherein said insulated gate electrode means in said notch comprises a first insulated gate electrode in said notch proximate said channel-containing regions of said first stack and a second insulated gate electrode in said notch proximite said channel-containing regions of said second stack, and wherein said gate voltage supply means comprises a first gate voltage source for applying said electrical potential to said first gate electrode and a second gate voltage source for applying electrical potential to said second gate electrode, and comprising means ohmically connecting and referencing said first gate voltage source to said first main electrode and to said first gate reference electrode, and means ohmically connecting and referencing said second gate voltage source to said second main terminal and to said second gate reference electrode.

* * * * *